US010727093B2

(12) United States Patent
Brillhart et al.

(10) Patent No.: US 10,727,093 B2
(45) Date of Patent: Jul. 28, 2020

(54) LIGHT PIPE WINDOW STRUCTURE FOR LOW PRESSURE THERMAL PROCESSES

(71) Applicant: Applied Materials, Inc., Santa Clara, CA (US)

(72) Inventors: Paul Brillhart, Pleasanton, CA (US); Joseph M. Ranish, San Jose, CA (US); Aaron Muir Hunter, Santa Cruz, CA (US); Edric Tong, Sunnyvale, CA (US); James Francis Mack, Woodside, CA (US); Kin Pong Lo, Fremont, CA (US); Errol Antonio C. Sanchez, Tracy, CA (US); Zhiyuan Ye, San Jose, CA (US); Anzhong Chang, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 816 days.

(21) Appl. No.: 14/645,883

(22) Filed: Mar. 12, 2015

(65) Prior Publication Data
US 2015/0340257 A1 Nov. 26, 2015

Related U.S. Application Data

(60) Provisional application No. 62/002,649, filed on May 23, 2014.

(51) Int. Cl.
*H01L 21/67* (2006.01)
*H01L 21/268* (2006.01)
(Continued)

(52) U.S. Cl.
CPC .......... *H01L 21/67115* (2013.01); *G02B 6/08* (2013.01); *H01L 21/2686* (2013.01);
(Continued)

(58) Field of Classification Search
CPC ........ G02B 6/08; G02B 17/00; G02B 17/002; G02B 17/006; H01L 21/2686;
(Continued)

(56) References Cited

U.S. PATENT DOCUMENTS 4,489,234 A * 12/1984 Harnden, Jr. ............. B32B 3/12
392/408
5,155,336 A * 10/1992 Gronet .................. C23C 16/481
219/390
(Continued)

FOREIGN PATENT DOCUMENTS

| CN | 1507648 A | 6/2004 |
|---|---|---|
| CN | 1922457 A | 2/2007 |

(Continued)

OTHER PUBLICATIONS

International Search Report, PCT/US2015/024735, dated Jun. 30, 2015.
(Continued)

*Primary Examiner* — Tu B Hoang
*Assistant Examiner* — Diallo I Duniver
(74) *Attorney, Agent, or Firm* — Patterson + Sheridan, LLP (57) ABSTRACT

Embodiments disclosed herein relate to a light pipe structure for thermal processing of semiconductor substrates. In one embodiment, a light pipe window structure for use in a thermal process chamber includes a transparent plate, and a plurality of light pipe structures formed in a transparent material that is coupled to the transparent plate, each of the plurality of light pipe structures comprising a reflective surface and having a longitudinal axis disposed in a substantially perpendicular relation to a plane of the transparent plate.

16 Claims, 9 Drawing Sheets

(51) Int. Cl.
*H01L 21/687* (2006.01)
*G02B 6/08* (2006.01)
*H05B 3/00* (2006.01)

(52) U.S. Cl.
CPC .. *H01L 21/67201* (2013.01); *H01L 21/68742* (2013.01); *H05B 3/0047* (2013.01)

(58) Field of Classification Search
CPC ......... H01L 21/67115; H01L 21/67201; H01L 21/68742; H01L 21/02104; H05B 3/0047
USPC .......... 219/411, 405; 392/416, 422; 118/724, 118/725
See application file for complete search history.

(56) References Cited

U.S. PATENT DOCUMENTS

| | | | |
|---|---|---|---|
| 6,232,580 B1 | 5/2001 | Sandhu | |
| 6,333,493 B1* | 12/2001 | Sakurai | F26B 3/28 118/725 |
| 6,350,964 B1 | 2/2002 | Boas et al. | |
| 7,509,035 B2* | 3/2009 | Ranish | H01L 21/67115 118/50.1 |
| 8,283,607 B2 | 10/2012 | Ranish et al. | |
| 2002/0148824 A1 | 10/2002 | Hauf et al. | |
| 2009/0212037 A1 | 8/2009 | Ranish et al. | |
| 2009/0255921 A1* | 10/2009 | Ranish | H01L 21/67115 219/448.13 |
| 2012/0145697 A1 | 6/2012 | Komatsu et al. | |
| 2013/0284095 A1 | 10/2013 | Ranish | |

FOREIGN PATENT DOCUMENTS

| | | |
|---|---|---|
| CN | 101128716 A | 2/2008 |
| CN | 101952946 A | 1/2011 |
| JP | 2002208466 A | 7/2002 |
| JP | 2007012846 A | 1/2007 |
| WO | 2011021549 A1 | 2/2011 |

OTHER PUBLICATIONS

Taiwan Office Action for Application No. 104115272 dated Sep. 14, 2018.
Japanese Office Action for Application No. 2017-514259 dated Dec. 4, 2018.
Chinese Office Action for Application No. 201580022142.0 dated Nov. 26, 2018.
Taiwan Office Action for Application No. 104115272 dated Feb. 26, 2019.
Taiwan Office Action for Application No. TW 104115272 dated Dec. 12, 2019.

* cited by examiner

LIGHT PIPE WINDOW STRUCTURE FOR LOW PRESSURE THERMAL PROCESSES

CROSS-REFERENCE TO RELATED APPLICATIONS

This application claims benefit of U.S. Provisional Patent Application Ser. No. 62/002,649 filed May 23, 2014, which is hereby incorporated by reference herein.

FIELD

Apparatus and methods for semiconductor processing are disclosed herein. More specifically, embodiments disclosed herein relate to a light pipe structure for thermal processing of semiconductor substrates that may be particularly useful in low pressure epitaxial deposition chambers and/or rapid thermal processing chambers.

BACKGROUND

Thermal processing is commonly practiced in the semiconductor industry. Semiconductor substrates are subjected to thermal processing in the context of many transformations, including deposition, doping, activation, and annealing of gate source, drain, and channel structures, siliciding, crystallization, oxidation, and the like. Over the years, techniques of thermal processing have progressed from simple furnace baking to various forms of increasingly rapid thermal processing (RTP), spike annealing, as well as other thermal processes.

As the critical dimensions of semiconductor device features continue to shrink, more stringent constraints on thermal budgets are sometimes required during thermal processes. Many of the aforementioned thermal processes utilize lamp heating in the form of a lamphead consisting of a plurality of light sources positioned to direct radiant energy toward a substrate. However, the high intensity lamps utilized in the lamphead create high temperatures within the material of the lamphead. This temperature is controlled for many processes to enable cooling of the substrate. For example, during RTP, thermal radiation from the lamps is generally used to rapidly heat a substrate in a controlled environment to a maximum temperature of up to about 1,350 degrees Celsius. This maximum temperature is maintained for a specific amount of time ranging from less than one second to several minutes depending on the process. The substrate is then cooled to room temperature for further processing. To enable the cooling to room temperature, the lamphead is cooled. However, control of the temperature of the lamphead is difficult based on many factors.

What is needed is a method and apparatus that enables improved temperature control of the lamphead within a thermal process chamber.

SUMMARY

Embodiments disclosed herein relate to a light pipe structure for thermal processing of semiconductor substrates.

In one embodiment, a light pipe window structure for use in a thermal process chamber is provided. The light pipe window structure includes a transparent plate, and a plurality of light pipe structures formed in a transparent material that is coupled to the transparent plate, each of the plurality of light pipe structures comprising a reflective surface and having a longitudinal axis disposed in a substantially perpendicular relation to a plane defined by a surface of the transparent plate.

In another embodiment, a lamphead assembly for use in a thermal process chamber is provided. The lamphead assembly includes a light pipe window structure, and a radiant heat source coupled to the light pipe window structure, wherein the light pipe window structure includes a plurality of light pipe structures formed in a transparent material, and the radiant heat source comprises a plurality of tubes, each of the plurality of tubes having an energy source disposed therein and being substantially aligned with one of the light pipe structures.

In another embodiment, a process chamber is provided. The process chamber includes a chamber having an interior volume, a light pipe window structure coupled to the chamber, the light pipe window structure having a transparent plate in communication with the interior volume of the chamber, and a radiant heat source coupled to the transparent plate of the light pipe window structure in a position outside of the interior volume of the chamber, wherein the light pipe window structure comprises a perforated transparent material coupled to the transparent plate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to light pipe window structures for a thermal processing chamber, such as deposition chambers, etch chambers, annealing chambers, implant chambers, chambers for light emitting diode formation, as well as other process chambers. The light pipe window structure may be utilized in process chambers available from Applied Materials, Inc. of Santa Clara, Calif., and may also be utilized in process chambers from other manufacturers as well.

Figure 1:
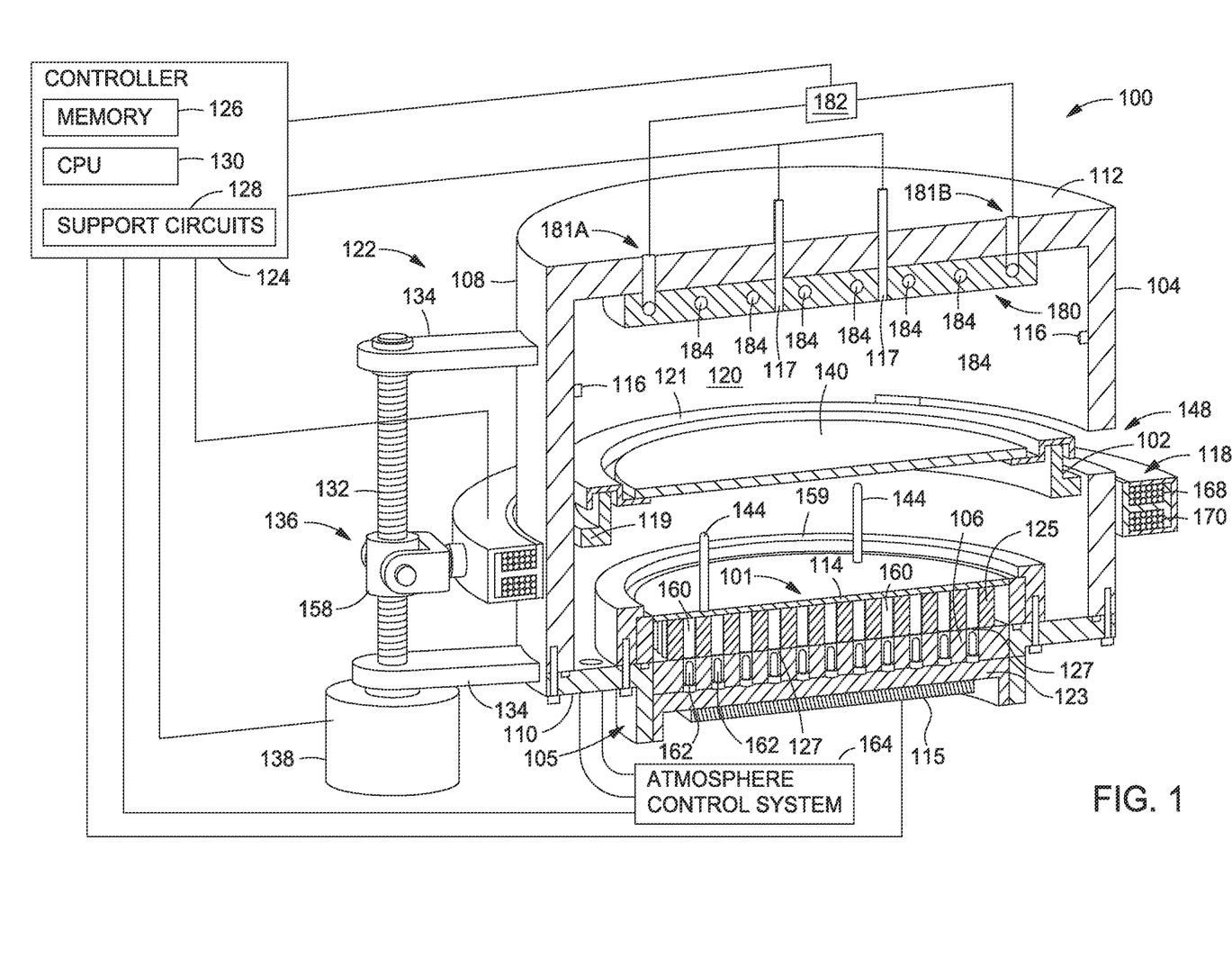
FIG. 1 is a simplified isometric view of a process chamber having one embodiment of a light pipe window structure.

FIG. 1 is a simplified isometric view of a rapid thermal process chamber 100 (RTP chamber) having a light pipe window structure 101 according to one embodiment. The process chamber 100 includes a contactless or magnetically levitated substrate support 102, and a chamber body 104 having a sidewall 108, a bottom 110, and a top 112 defining an interior volume 120. The sidewall 108 typically include a substrate access port 148 to facilitate entry and egress of a substrate 140 (a portion of which is shown in FIG. 1). The access port 148 may be coupled to a transfer chamber (not shown) or a load lock chamber (not shown) and may be selectively sealed with a valve, such as a slit valve (not shown). In one embodiment, the substrate support 102 is annular and is sized to accommodate a lamphead assembly 105 in an inside diameter of the substrate support 102. The lamphead assembly 105 includes the light pipe window structure 101 and a radiant heat source 106.

The substrate support 102 is adapted to magnetically levitate and rotate within the interior volume 120. The substrate support 102 is capable of rotating while raising and lowering vertically during processing, and may also be raised or lowered without rotation before, during, or after processing. This magnetic levitation and/or magnetic rotation prevents or minimizes particle generation due to the absence or reduction of parts rotating and/or contact between parts moving relative to each other that are typically used to raise/lower and/or rotate the substrate support.

A stator assembly 118 circumscribes the sidewall 108 of the chamber body 104 and is coupled to one or more actuator assemblies 122 that control the elevation of the stator assembly 118 along the exterior of the chamber body 104. In one embodiment (not shown), the process chamber 100 includes three actuator assemblies 122 disposed radially about the chamber body, for example, at about 120 degree angles about the chamber body 104. The stator assembly 118 is magnetically coupled to the substrate support 102 disposed within the interior volume 120 of the chamber body 104. The substrate support 102 may comprise a magnetic portion to function as a rotor 119, thus creating a magnetic bearing assembly to lift and/or rotate the substrate support 102. A support ring 121 is coupled to the rotor 119 to support a peripheral edge of the substrate 140. The support ring 121 is sized to stably support the substrate 140 while minimally shielding portions of the backside of the substrate 140 from energy emitted by the radiant heat source 106. The stator assembly 118 includes a drive coil assembly 168 stacked on a suspension coil assembly 170. The drive coil assembly 168 is adapted to rotate and/or raise/lower the substrate support 102 while the suspension coil assembly 170 may be adapted to passively center the substrate support 102 within the process chamber 100. Alternatively, the rotational and centering functions may be performed by a stator having a single coil assembly.

In one embodiment, each of the actuator assemblies 122 generally comprises a precision lead screw 132 coupled between two flanges 134 extending from the sidewall 108 of the chamber body 104. The lead screw 132 has a nut 158 that axially travels along the lead screw 132 as the screw rotates. A coupling 136 is placed between the stator assembly 118 and the nut 158, and couples the nut 158 to the stator assembly 118 so that as the lead screw 132 is rotated, the coupling 136 is moved along the lead screw 132 to control the elevation of the stator assembly 118 at the interface with the coupling 136. Thus, as the lead screw 132 of one of the actuator assemblies 122 is rotated to produce relative displacement between each of the nuts 158 of the other actuator assemblies 122, the horizontal plane of the stator assembly 118 changes relative to a central axis of the chamber body 104.

In one embodiment, a motor 138, such as a stepper or servo motor, is coupled to the lead screw 132 to provide controllable rotation in response to a signal by the controller 124. Alternatively, other types of actuator assemblies 122 may be utilized to control the linear position of the stator assembly 118, such as pneumatic cylinders, hydraulic cylinders, ball screws, solenoids, linear actuators and cam followers, among others.

Examples of a RTP chamber that may be adapted to benefit from the embodiment disclosed herein are VANTAGE®, VULCAN®, and CENTURA® processing systems, available from Applied Materials, Inc., located in Santa Clara, Calif. Although the apparatus is described as utilized with a rapid thermal processing chamber as well as an epitaxial deposition chamber, embodiments described herein may be utilized in other processing systems and devices where lamp heating devices are used for heating.

The light pipe window structure 101 includes a transparent plate 114 and a transparent body 125. The term "transparent" as used herein is the ability of the material to transmit radiation, for example light waves or other wavelengths used for heating other objects and, in particular, wavelengths in the visible spectrum as well as non-visible wavelengths, such as in the infra-red (IR) spectrum. For example, the transparent plate 114 and the transparent body 125 may be made from a material transparent to heat and light of various wavelengths, which may include light in the IR spectrum. In some embodiments, the transparent plate 114 and a transparent body 125 are transparent to IR radiation in a wavelength range extending from the nominal red edge of the visible spectrum (e.g., wavelengths about 700 nanometers (nm) to about 800 nm) to about 1 millimeter (mm).

The light pipe window structure 101 includes a plurality of light pipe structures 160 formed in the transparent body 125. Each of the plurality of light pipe structures 160 may include a tubular structure or perforations, in the form of columns, among other shapes, and substantially axially align with a plurality of energy sources 162 of the radiant heat source 106. The term "tubular" as used herein denotes a structure having an interior volume contained between a sidewall thereof. The close-packed arrangement of light pipe structures 160 are sized and spaced to substantially axially align with each of the tubes 127 of the radiant heat source 106 (shown in FIG. 1) in one embodiment. However, some misalignment between the tubes 127 and the light pipe structures 160 may also be utilized to provide a high-power density and good spatial resolution. The transparent plate 114 may have a substantially uniform thickness and may have a solid cross-section. For example, the transparent plate 114 may be free of perforations. The light pipe structures 160 are provided as light pipes through which photons from the plurality of energy sources 162 of the radiant heat source 106 may pass to heat the substrate 140 during processing. In one embodiment, the light pipe structures are hollow. In another embodiment, the light pipe structures are hollow and covered on the lateral surfaces with a reflective coating, such as a metallic reflector, Ag, Al, Cr, Au, Pt, etc or a dielectric stack reflector. In another embodiment, the light pipe structures have solid transparent body 800 (shown in FIG. 8) inserted within where the solid body provides total internal reflection (TIR). In another embodiment, the light pipe structures have a reflector inserted within where the reflector may be thermally coupled to a cooled lamphead or the reflector may be cooled by convection.

The process chamber 100 also includes one or more proximity sensors 116, which are generally adapted to detect the elevation of the substrate support 102 (or substrate 140) within the interior volume 120 of the chamber body 104. The sensors 116 may be coupled to the chamber body 104 and/or other portions of the process chamber 100 and are adapted to provide an output indicative of the distance between the substrate support 102 and the top 112 and/or bottom 110 of the chamber body 104, and may also detect misalignment of the substrate support 102 and/or the substrate 140.

The process chamber 100 also includes a controller 124, which generally includes a central processing unit (CPU) 130, support circuits 128 and memory 126. The CPU 130 may be one of any form of computer processor that can be used in an industrial setting for controlling various actions and sub-processors. The memory 126, or computer-readable medium, may be one or more of readily available memory such as random access memory (RAM), read only memory (ROM), floppy disk, hard disk, or any other form of digital storage, local or remote, and is typically coupled to the CPU 130. The support circuits 128 are coupled to the CPU 130 for supporting the controller 124 in a conventional manner. These circuits include cache, power supplies, clock circuits, input/output circuitry, subsystems, and the like.

The lamphead assembly 105 may include both of the radiant heat source 106 and the light pipe window structure 101. The light pipe window structure 101 may include a retainer 159 that at least partially surrounds the light pipe window structure 101. The retainer 159 may be a sealing member, such as an o-ring, or a rim that is clamped to the side wall 108 of the process chamber 100. In some embodiments, the retainer 159 may comprise a rim used for clamping the light pipe window structure 101 to the side wall 108, and may include an o-ring that is disposed between the transparent plate 114 and the transparent body 125. The radiant heat source 106 includes a lamp assembly formed from a housing 123 which includes a plurality of closely spaced tubes 127. The tubes 127 may be formed in a honeycomb-like light pipe arrangement. The housing 123 may comprise a billet formed from a metallic material, such as a copper material, and may include sockets, with an energy source 162 disposed in each socket. A circuit board 115 may be coupled to the housing 123 and the controller 124 to control the energy sources 162. The energy sources 162 may be controlled individually or in zones 162.

Each tube 127 may contain a reflector and one energy source 162, which may be a high-intensity lamp, a laser, a laser diode, a light emitting diode, an IR emitter, or combinations thereof. Each tube 127 may be substantially axially aligned with each of the light pipe structures 160 of the light pipe window structure 101. The light pipe structures 160 are utilized to transmit energy emitted by each of the energy sources 162 toward the substrate 140. In one embodiment, the lamphead assembly 105 provides sufficient radiant energy to thermally process the substrate 140, for example, annealing a silicon layer disposed on the substrate 140. The lamphead assembly 105 may further comprise annular zones, wherein the voltage supplied to the plurality of energy sources 162 by the controller 124 may be varied to enhance the radial distribution of energy from the lamphead assembly 105. Dynamic control of the heating of the substrate 140 may be affected by the one or more temperature sensors 117 (described in more detail below) adapted to measure the temperature across the substrate 140.

In one embodiment, both of the transparent plate 114 and the transparent body 125 are made from a quartz material, although other materials that are transparent to energy, such as wavelengths in the infra-red spectrum, may be used, such as sapphire. The transparent plate 114 and the transparent body 125 may be made from a clear fused quartz material having low inclusion tolerances. The transparent plate 114 includes a plurality of lift pins 144 coupled to an upper surface of the transparent plate 114 to facilitate transfer of the substrate into and out of the process chamber 100. For example, the stator assembly 118 may be actuated to move downward which causes the rotor 119 to move toward the lamphead assembly 105. Any direction used herein such as "downward" or "down" as well as "upward" or "up" are based on the orientation of the chamber in the drawings as shown and may not be the actual direction in practice.

The support ring 121, which supports the substrate 140, moves with the rotor 119. At a desired elevation, the substrate 140 contacts the lift pins 144 disposed on the transparent plate 114. The downward movement of the rotor 119 (and support ring 121) may continue until the rotor 119 surrounds the retainer 159 of the lamphead assembly 105. The downward movement of the rotor 119 (and support ring 121) continues until the support ring 121 is spaced a distance away from the substrate 140, which is stably supported on the lift pins 144. The height of the lift pins 144 may be chosen to support and align the substrate 140 along a plane that is substantially coplanar or adjacent a plane of the substrate access port 148. The plurality of lift pins 144 may be positioned between the light pipe structures 160 and radially spaced from each other to facilitate passage of an end effector (not shown) through the substrate access port 148. Alternatively, the end effector and/or robot may be capable of horizontal and vertical movement to facilitate transfer of the substrate 140. Each of the plurality of lift pins 144 may be positioned between the light pipe structures 160 to minimize absorption of energy from the radiant heat source 106. Each of the plurality of lift pins 144 may be made from the same material used for the transparent plate 114, such as a quartz material.

An atmosphere control system 164 is also coupled to the interior volume 120 of the chamber body 104. The atmosphere control system 164 generally includes throttle valves and vacuum pumps for controlling chamber pressure. The atmosphere control system 164 may additionally include gas sources for providing process or other gases to the interior volume 120. The atmosphere control system 164 may also be adapted to deliver process gases for thermal deposition processes. During processing, the interior volume 120 is generally maintained at vacuum pressures. Aspects of the invention include embodiments where the lamphead assembly 105 is at least partially disposed in the interior volume 120 (and subject to negative pressure therein) while a portion of the lamphead assembly 105 is outside of the interior volume 120 (i.e., in ambient atmosphere). This arrangement provides efficient transmission of energy to the substrate 140 while enhancing the ability to control the temperature of the radiant heat source 106.

The process chamber 100 also includes one or more temperature sensors 117, which may be adapted to sense temperature of the substrate 140 before, during, and after processing. In the embodiment depicted in FIG. 1, the temperature sensors 117 are disposed through the top 112, although other locations within and around the chamber body 104 may be used. The temperature sensors 117 may be optical pyrometers, as an example, pyrometers having fiber optic probes. The sensors 117 may be adapted to couple to the top 112 in a configuration to sense the entire diameter of the substrate, or a portion of the substrate. The sensors 117 may comprise a pattern defining a sensing area substantially equal to the diameter of the substrate, or a sensing area substantially equal to the radius of the substrate. For example, a plurality of sensors 117 may be coupled to the top 112 in a radial or linear configuration to enable a sensing area across the radius or diameter of the substrate. In one embodiment (not shown), a plurality of sensors 117 may be disposed in a line extending radially from about the center of the top 112 to a peripheral portion of the top 112. In this manner, the radius of the substrate may be monitored by the sensors 117, which will enable sensing of the diameter of the substrate during rotation.

The process chamber 100 also includes a cooling block 180 adjacent to, coupled to, or formed in the top 112. Generally, the cooling block 180 is spaced apart and opposing the lamphead assembly 105. The cooling block 180 comprises one or more coolant channels 184 coupled to an inlet 181A and an outlet 181B. The cooling block 180 may be made of a process resistant material, such as stainless steel, aluminum, a polymer, or a ceramic material. The coolant channels 184 may comprise a spiral pattern, a rectangular pattern, a circular pattern, or combinations thereof and the channels 184 may be formed integrally within the cooling block 180, for example by casting the cooling block 180 and/or fabricating the cooling block 180 from two or more pieces and joining the pieces. Additionally or alternatively, the coolant channels 184 may be drilled into the cooling block 180. The inlet 181A and outlet 181B may be coupled to a coolant source 182 by valves and suitable plumbing and the coolant source 182 is in communication with the controller 124 to facilitate control of pressure and/or flow of a fluid disposed therein. The fluid may be water, ethylene glycol, nitrogen ($N_2$), helium (He), or other fluid used as a heat exchange medium.

As described herein, the process chamber 100 is adapted to receive a substrate in a "face-up" orientation, wherein the deposit receiving side or face of the substrate is oriented toward the cooling block 180 and the "backside" of the substrate is facing the lamphead assembly 105. The "face-up" orientation may allow the energy from the lamphead assembly 105 to be absorbed more rapidly by the substrate 140 as the backside of the substrate is may be less reflective than the face of the substrate.

Conventional lamphead assemblies for some thermal chambers may be dome shaped (i.e., angled or curved from edge to center) in order to provide structural integrity to the lamphead assembly in order to withstand low pressures in the chamber. When the lamphead assembly is dome shaped, for example in an epitaxy chamber, the distance between the individual lamps and the substrate is varied, which may detrimentally affect heating and/or heating time of the substrate. However, the light pipe window structure 101 as described herein provides a lamphead assembly 105 wherein the energy sources 162 are substantially the same distance from the substrate 140. Embodiments of the light pipe window structure 101 as described herein may reduce the distance between the energy sources 162 and the substrate 140 by about 27% to about 44% (the 27% may be compared to a lamp closest to the substrate in a conventional dome-shaped lamphead assembly and the 44% may be compared to a lamp farthest from the substrate in a conventional dome-shaped lamphead assembly). In some embodiments, the distance between an uppermost portion of each energy source 162 is about 75 mm from the substrate 140 when the substrate 140 is in the lowermost processing position.

Figure 2A:
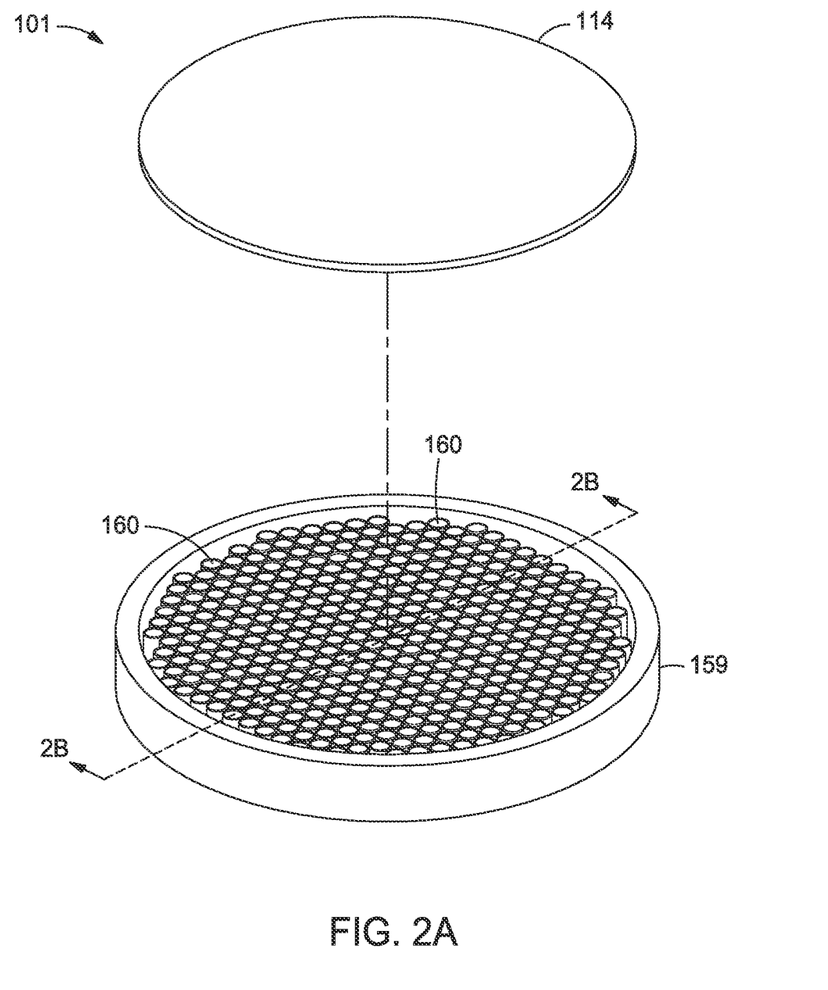
FIGS. 2A-2D are various views showing one embodiment of the light pipe window structure of FIG. 1.
Figure 2B:
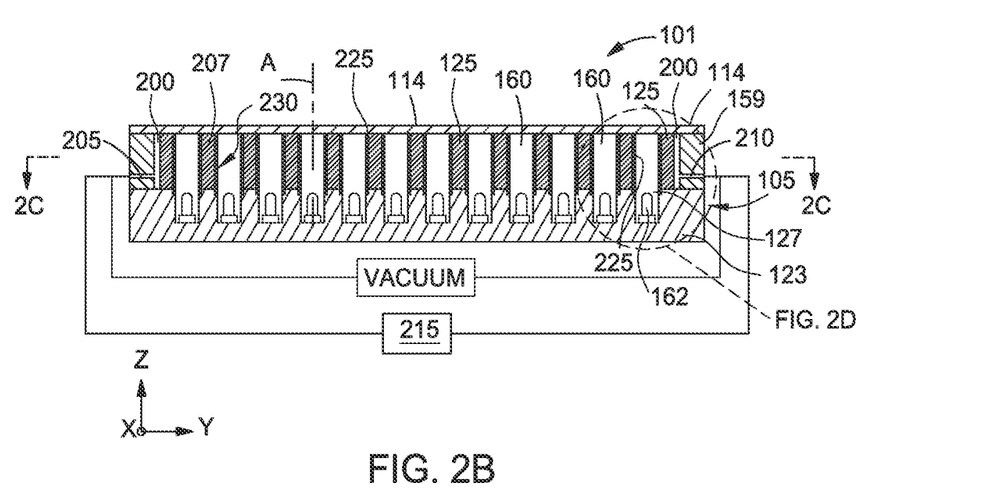
Figure 2C:
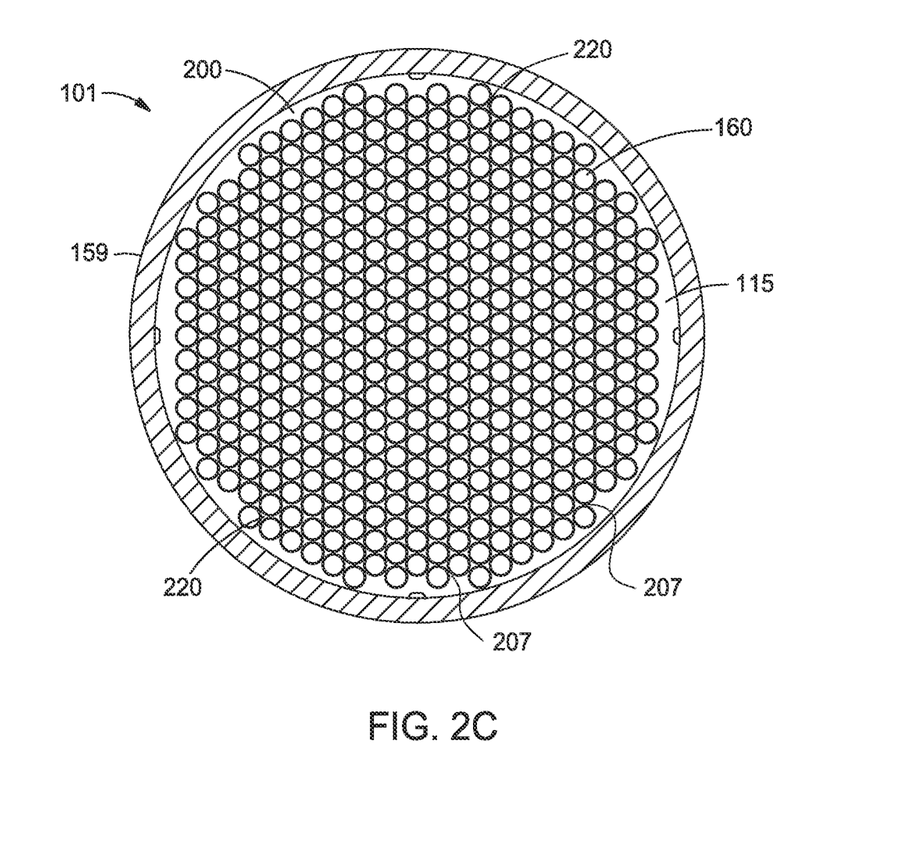

FIGS. 2A-2C are various views showing one embodiment of the light pipe window structure 101 that may be utilized in the process chamber 100 of FIG. 1. FIG. 2A is an isometric, partially exploded view of the light pipe window structure 101. FIG. 2B is a cross-sectional view of the light pipe window structure 101 across section lines 2B-2B of FIG. 2A. FIG. 2C is a cross-sectional view of the light pipe window structure 101 across section lines 2C-2C of FIG. 2B. The lift pins 144 shown in FIG. 1 are not shown in FIGS. 2A-2C.

In one embodiment, the light pipe window structure 101 includes the retainer 159, the transparent plate 114 and the transparent body 125. As shown, the transparent plate 114 may be a solid, planar member that is coupled to the retainer 159. Both of the transparent plate 114 and the transparent body 125 may be made from a transparent material, such as quartz or sapphire. Likewise, the retainer 159 may be made from a transparent material such as quartz. Both of the transparent plate 114 and the transparent body 125 may be joined by a diffusion welding process or other suitable joining method. Each of the light pipe structures 160 may be a hollow tube.

The cross-section of the light pipe structures 160 may include circular shapes, rectangular shapes, triangular shapes, diamond shapes, hexagonal shapes, or combinations thereof, or other polygonal and/or irregular shapes. One method to form the light pipe window structure 101 includes gun drilling a block of a transparent material to produce the light pipe structures 160. In one embodiment, the transparent body 125 may comprise a perforated transparent material, wherein each of the perforations form the light pipe structures 160. The transparent plate 114 may be joined to the transparent body 125 (i.e., the material remaining between the light pipe structures 160) by a joining process, such as ceramic solder techniques, seal glass bonding, a diffusion welding process or other suitable joining method. The light pipe structures 160 are shown having an annular cross-section but in some embodiments the cross-sectional shape of at least a portion of the light pipe structures 160 may be hexagonal. In an alternative forming method, the light pipe window structure 101 may be formed of sintered quartz using shaped columns of a consumable material to form the light pipe structures 160. For example, columns of a consumable material, such as carbon, may be spaced in a close-packed arrangement and quartz sintered around the carbon to form the transparent body 125. Thereafter, the consumable material may be burned out to form the light pipe structures 160. The columns may comprise a round shape in cross-section to produce annular light pipe structures 160, or a polygonal shape to produce light pipe structures 160 having a polygonal shape in cross-section.

As shown in FIG. 2B, each of the light pipe structures 160 include a longitudinal axis A that is substantially perpendicular to a plane defined by a major surface of the transparent plate 114. The term "substantially perpendicular" as used herein refers to an angle slightly greater than or less than 90 degrees, such as about 80 degrees to about 100 degrees, for example about 85 degrees to about 95 degrees, relative to a plane of a major surface of the transparent plate 114. In one embodiment, when the transparent plate 114 is coupled to the retainer 159 and the housing 123 of the lamphead assembly 105, a sealed or sealed internal volume 200 may be contained within the interior sidewalls of the retainer 159, as well as in voids 207 between the light pipe structures 160, the transparent plate 114 and the transparent body 125. In some embodiments, the retainer 159 may include an inlet port 205 and an outlet port 210. The inlet port 205 and the outlet port 210 may be coupled to a coolant source 215 which circulates a fluid through the sealed internal volume 200 as well as voids 207 between light pipe structures 160 in order to cool the light pipe window structure 101. The fluid may be water, ethylene glycol, nitrogen ($N_2$), helium (He), or other fluid used as a heat exchange medium. Small gaps 220 (shown in FIG. 2C) provide flow of the fluid around the light pipe structures 160 to facilitate cooling of each of the light pipe structures 160. In addition, or as an alternative, to flow of cooling fluid through the inlet port 205 and the outlet port 210, one or both of the inlet port 205 and the outlet port 210 may be coupled to a vacuum pump (shown in FIG. 2B) in order to provide a low pressure to the sealed internal volume 200, and the voids 207 and gaps 220 between the light pipe structures 160. The vacuum pump may be utilized to reduce the pressure in the sealed internal volume 200 and voids 207 and reduce a pressure gradient between the interior volume 120 and the sealed internal volume 200.

Referring again to FIG. 1, the transparent plate 114 may be exposed to low pressures in the interior volume 120 of the chamber body 104. The pressure the transparent plate 114 is exposed to may be about 80 Torr, or higher vacuum, such as about 5 Torr to about 10 Torr. Bonding of the transparent body 125 to both of the transparent plate 114 and the housing 123 provides additional structural rigidity to the transparent plate 114 thus allowing the transparent plate 114 to withstand the pressure differential without failure. In one embodiment, the thickness of the transparent plate 114 may be between about 3 mm to about 10 mm. In some embodiments, the transparent plate 114 is about 6 mm. The thickness of the transparent body 125 of the light pipe window structure 101 may be about 39 mm to about 44 mm in one embodiment, such as about 40 mm. The dimensions of the light pipe structures 160 may include a major dimension, which may be a diameter, that is substantially equal to a major dimension (e.g., a diameter) of the tubes 127 of the radiant heat source 106. The length of the light pipe structures 160 may be the same as the thickness of the transparent body 125.

Referring again to FIG. 2B, the light pipe structures 160 may include a reflective surface 225. The reflective surface 225 may comprise a sleeve, a coating, or combinations thereof, made of a reflective material, such as silver (Ag) or gold (Au). In some embodiments, the reflective surface 225 comprises a tubular sleeve 230 that lines the interior surfaces of each of the light pipe structures 160. In some embodiments, each of the tubular sleeves 230 are coupled to the housing 123 of the lamphead assembly 105 and are configured to engage with the interior surfaces of the light pipe structures 160 to enable passive or convective cooling.

Figure 2D:
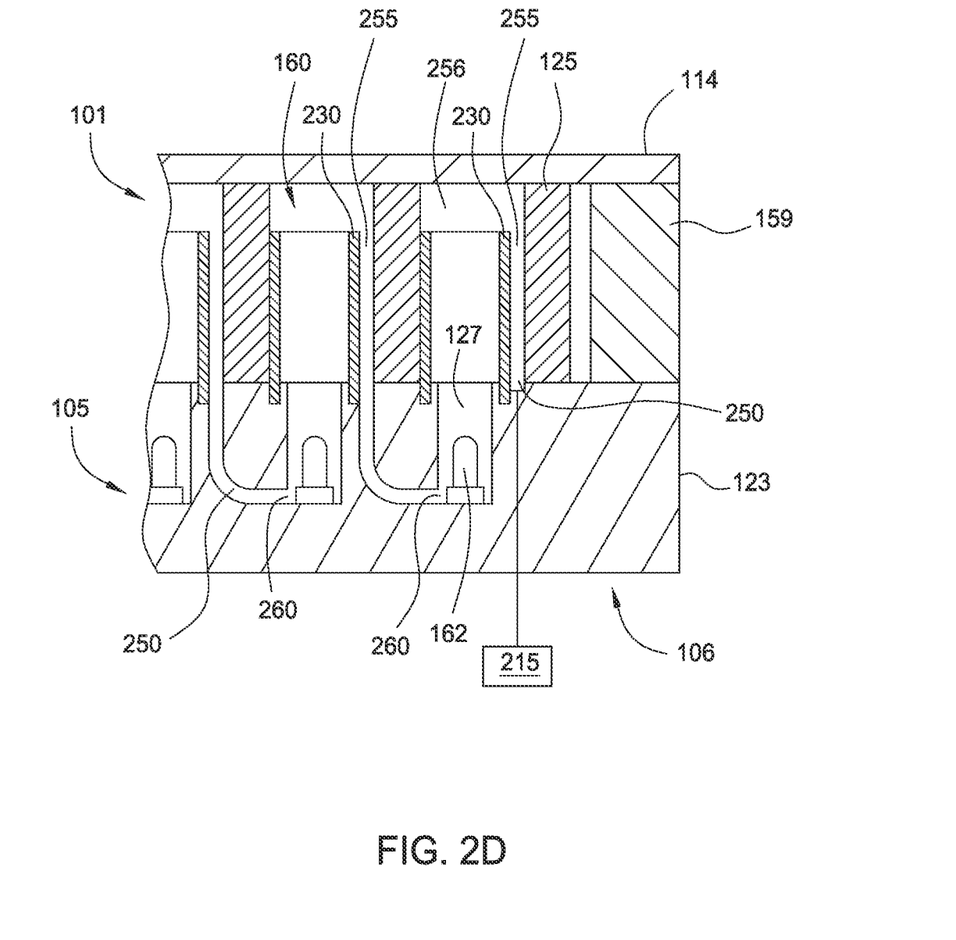

FIG. 2D is an enlarged view of a portion of the light pipe window structure 101 and lamphead assembly 105 shown in FIG. 2B showing another embodiment of a coolant flow path for cooling one or both of the light pipe window structure 101 and the housing 123 of the lamphead assembly 105. In this embodiment, the inlet port 205 (shown in FIG. 2B) and the outlet port 210 are not utilized. Instead, the coolant source 215 is coupled to a fluid conduit 250 formed in the housing 123. The fluid conduit 250 may be used to flow a coolant as described above through the housing 123 as well as into and/or around the light pipe structures 160. In some embodiments, the coolant may be flowed through the fluid conduit 250 to cool the tubular sleeve 230 as well as the energy sources 162.

In one embodiment, coolant is flowed from the coolant source 215 to the fluid conduit 250 and through a first channel 255 formed between the tubular sleeve 230 and the transparent body 125. The tubular sleeve 230 may be sized to have a length that is slightly less than a thickness of the transparent body 125 such that coolant fluid flows into a plenum 256 formed between an upper surface of the tubular sleeve 230 and a lower surface of the transparent plate 114. The coolant may then be flow downward toward the tubes 127 of the radiant heat source 106 and into one or more second channels 260 adjacent the energy source 162. At least a portion of the second channels 260 may fluidly couple the tubes 127 of the radiant heat source 106 with an adjacent first channel 255. In this manner, cooling fluid may be used to cool the tubular sleeves 230, the energy sources 162 and portions of the housing 123 of the lamphead assembly 105.

Figure 3:
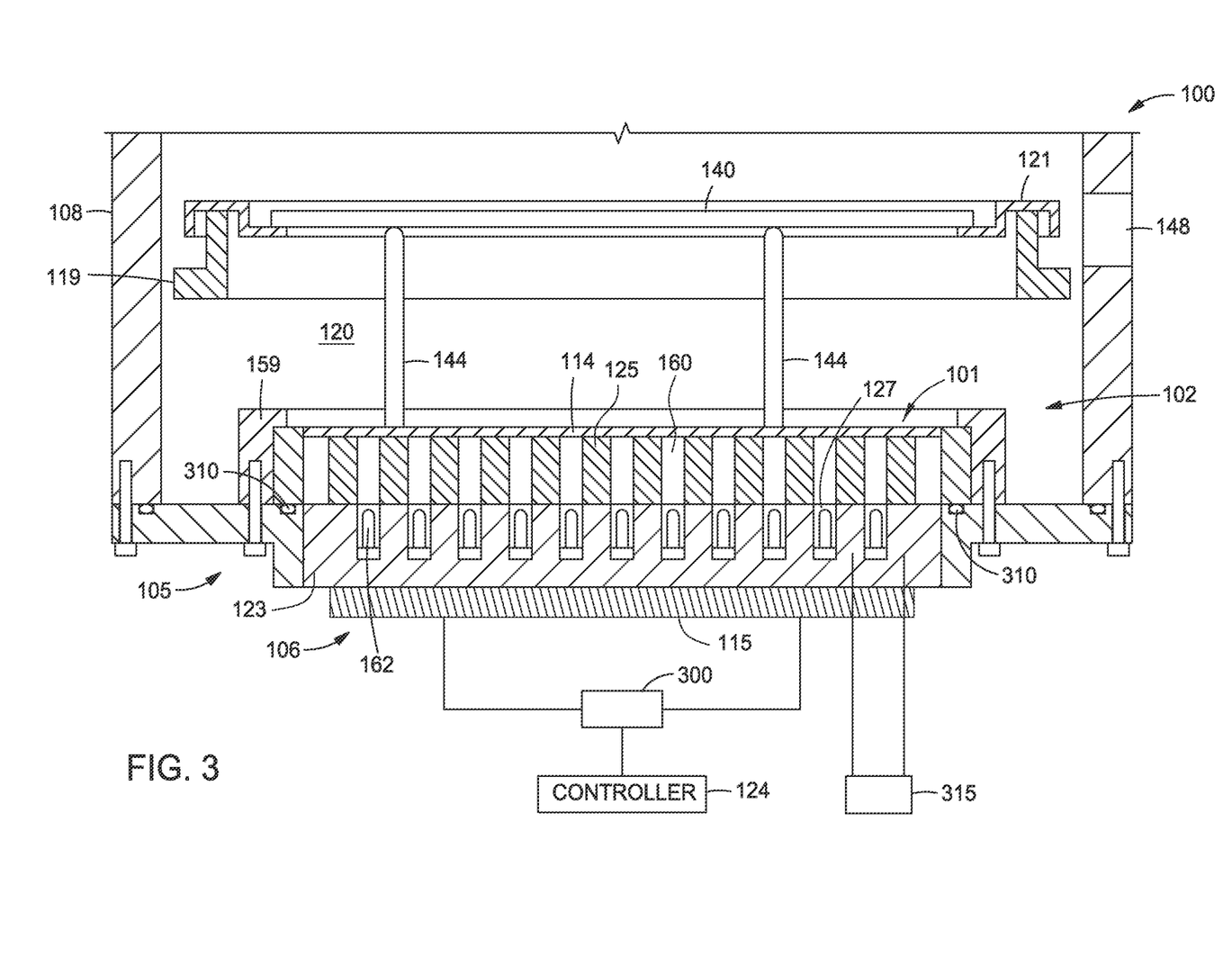
FIG. 3 is a side cross-sectional view of a portion of the process chamber of FIG. 1 showing details of the light pipe window structure and a lamphead assembly.

FIG. 3 is a side cross-sectional view of a portion of the process chamber 100 of FIG. 1. In this Figure, the substrate 140 is supported by the lift pins 144 and the support ring 121. The position of the substrate 140 may be used to begin a thermal process on the substrate 140 after transfer into the process chamber 100 where the substrate 140 may be heated by the radiant heat source 106. If the support ring 121 is hotter than the substrate 140, open loop heating by the radiant heat source 106 may be utilized to raise the temperature of the substrate (supported by the lift pins 144) to near the temperature of the support ring 121 in order to prevent thermal stress in the substrate 140. When heated sufficiently the substrate 140 may be transferred to the support ring 121 and raised away from the lift pins 144 to allow rotation of the substrate 140 during processing.

In order to heat the substrate 140, the energy sources 162 of the radiant heat source 106 are provided with power from a power source 300. The power source 300 may be a multi-zone power source providing energy to one or more groups of the energy sources 162 of the radiant heat source 106. For example, a first or outer zone 305A may include an outer set of energy sources 162 or subset of the energy sources 162 on the periphery of the housing 123. Likewise, a second or inner zone 305B may include a set or subset of the energy sources 162 within the outer zone 305A. In one embodiment, the energy sources 162 may be divided into about ten concentric zones that may be individually controlled in a closed loop heating regime.

When heating the substrate 140, the lamphead assembly 105, particularly the radiant heat source 106, experiences elevated temperatures, and the temperature of the radiant heat source 106 may be adequately controlled according to embodiments described herein. For example, at least a portion of the lamphead assembly 105 is disposed outside of the interior volume 120 of the process chamber 100 (i.e., in ambient pressure) which provides enhanced temperature control of the radiant heat source 106. The improved temperature control of the radiant heat source 106 facilitates greater efficiency of the process chamber 100.

In one embodiment, the radiant heat source 106 is coupled to a coolant source 315 to facilitate enhanced cooling of the housing 123 of the radiant heat source 106. The coolant source 315 may be coolant such as water, ethylene glycol, nitrogen ($N_2$), helium (He), or other fluid used as a heat exchange medium. The coolant may be flowed throughout the housing 123 and in between the energy sources 162 of the radiant heat source 106.

Figure 4:
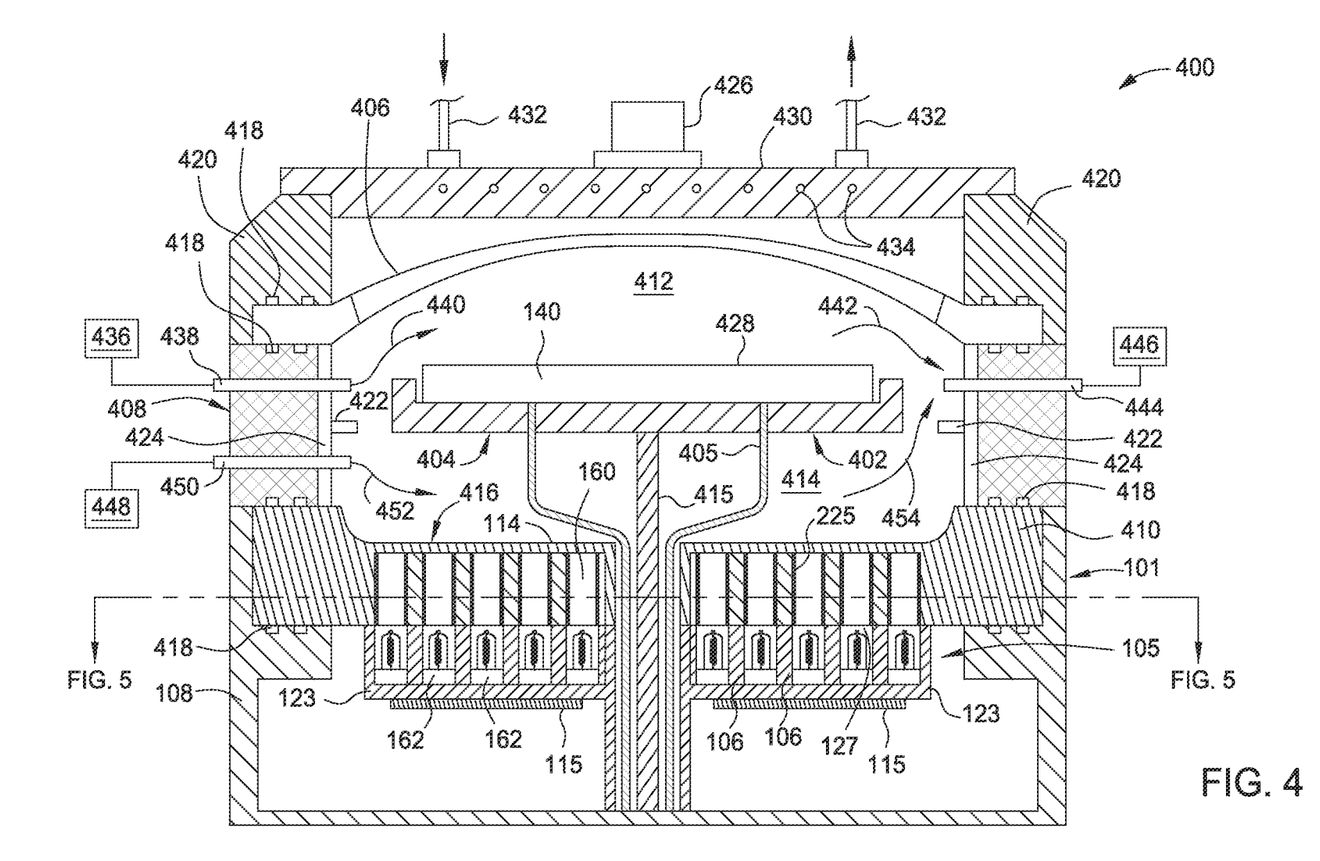
FIG. 4 is a schematic sectional view of a process chamber showing another embodiment of a light pipe window structure.

FIG. 4 illustrates a schematic sectional view of a process chamber 400 having another embodiment of the light pipe window structure 101 disposed thereon. The process chamber 400 may be used to process one or more substrates, including the deposition of a material on an upper surface of a substrate 140. While not discussed in detail herein, the deposited material may include gallium arsenide, gallium nitride, or aluminum gallium nitride. The process chamber 400 may include a lamphead assembly 105 as described herein, which includes an array of energy sources 162 for heating, among other components, a back side 402 of a substrate support 404 disposed within the process chamber 400. The substrate support 404 may be a disk-like substrate support 404 as shown, or may be a ring-like substrate support similar to the support ring 121 shown in FIGS. 1 and 3, which supports the substrate from the edge of the substrate to facilitate exposure of the substrate to the thermal radiation of the light pipe window structure 101. In FIG. 4, like reference numerals will be used with components similar to the components described in FIGS. 1-3, and unless noted, operate similarly and the description will not be repeated for brevity. Additionally, embodiments of the light pipe window structure 101 described in FIG. 4 may be utilized in the process chamber 100 of FIGS. 1 and 3, and vice versa.

The substrate support 404 is located within the process chamber 400 between an upper dome 406 and a transparent plate 114 of the light pipe window structure 101. The upper dome 406, the upper surface of the transparent plate 114 and a base ring 408, that is disposed between the upper dome 406 and a mounting flange or rim 410 of the light pipe window structure 101, generally define an internal region of the process chamber 400. The substrate support 404 generally divides the internal volume of the process chamber 400 into a process region 412 that is above the substrate, and a purge region 414 below the substrate support 404. The substrate support 404 may be rotated during processing by a central shaft 415 to minimize the effect of thermal and process gas flow spatial anomalies within the process chamber 400 and thus facilitate uniform processing of the substrate 140. The substrate support 404 is supported by the central shaft 415, which may move the substrate 140 in a vertical direction (shown by arrows) during substrate transfer processes, and in some instances, processing of the substrate 140. The substrate support 404 may be formed from silicon carbide or graphite coated with silicon carbide to absorb radiant energy from the energy sources 162 and conduct the radiant energy to the substrate 140. A plurality of lift pins 405 may be disposed in the process chamber 400 outward of the central shaft 415. The lift pins 405 may be coupled to an actuator (not shown) to move the lift pins 405 vertically within the process chamber 400 relative to, and independent of, the substrate support 404. The substrate 140 can be transferred into the process chamber 400 and positioned onto the substrate support 404 through a loading port (not shown). The substrate support 404 is shown in an elevated processing position in FIG. 4, but may be vertically traversed by an actuator (not shown) to a loading position below the processing position to allow lift pins 405 to contact the substrate 140 and space the substrate 140 away from the substrate support 404. A robot (not shown) may then enter the process chamber 400 to engage and remove the substrate 140 therefrom though the loading port.

In general, the upper dome 406 and the transparent plate 114, as well as the transparent body 125 are formed from a transparent material such a quartz material, or a sapphire material as described above. In this embodiment, the transparent plate 114 of the light pipe window structure 101 includes a recessed portion 416, which may provide additional structural rigidity to the light pipe window structure 101. However, in other embodiments, the transparent plate 114 may be flat or planar as shown in FIG. 1. The recessed portion 416 provides a concave or a dome shape to the light pipe window structure 101 and may enable thinner cross-sectional dimensions of the transparent plate 114 to provide structural rigidity while operating at lower pressures.

In one embodiment, the thickness of the light pipe window structure 101 having the transparent plate 114 that is planar may be about 40 mm while the thickness of the light pipe window structure 101 having the transparent plate 114 with a concave shape (e.g., the recessed portion 416 shown in FIG. 4) may be about 35 mm. The rim 410 of the light pipe window structure 101 may be coupled between a sidewall 108 and the base ring 408. Seals 418, such as o-rings, may be used to seal the rim 410 to the sidewall 108 and the base ring 408. The upper dome 406 may be coupled to the base ring 408 and a clamp ring 420 using seals 418 disposed therebetween for sealing.

The energy sources 162 may be configured to heat the substrate 140 to a temperature within a range of about 200 degrees Celsius to about 1,600 degrees Celsius. Each energy source 162 may be coupled to a power source 300 and a controller (shown in FIG. 3). The lamphead assembly 105 may be cooled during or after processing by a coolant source 315 as shown and described in FIG. 3. Alternatively or in addition, the lamphead assembly 105 may be cooled by convective cooling.

In one embodiment, at least a portion of one or both of the light pipe structures 160 and the energy sources 162 may be angled inwardly toward a central axis of the process chamber 400. For example, the light pipe structures 160 and/or the energy sources 162 near the central shaft 415 may tilted inwardly at about 30 degrees to about 45 degrees relative to a plane of the transparent plate 114 to direct radiant energy toward a center region of the substrate support 404 (i.e., above the central shaft 415). In one example, radiant energy from at least a portion of the energy sources 162 pass through the transparent plate 114 at a non-normal angle relative to the plane of the transparent plate 114.

A circular shield 422 may be optionally disposed around the substrate support 404. The base ring 408 may also be surrounded by a liner assembly 424. The shield 422 prevents or minimizes leakage of heat/light noise from the energy source 162 to the device side 428 of the substrate 140 while providing a pre-heat zone for the process gases. The shield 422 may be made from CVD SiC, sintered graphite coated with SiC, grown SiC, opaque quartz, coated quartz, or any similar, suitable material that is resistant to chemical breakdown by process and purging gases. The liner assembly 424 is sized to be nested within or surrounded by an inner circumference of the base ring 408. The liner assembly 424 shields the processing volume (i.e., the process region 412 and purge region 414) from metallic walls of the process chamber 400. The metallic walls may react with precursors and cause contamination in the processing volume. While the liner assembly 424 is shown as a single body, the liner assembly 424 may include one or more liners.

The process chamber 400 may also include an optical pyrometer 426 for temperature measurement/control on the substrate 140. The temperature measurement by the optical pyrometer 426 may be performed on a device side 428 of the substrate 140. As a result, the optical pyrometer 426 may only sense radiation from the hot substrate 140, with minimal background radiation from the energy source 162 directly reaching the optical pyrometer 426. A reflector 430 may be optionally placed outside the upper dome 406 to reflect light that is radiating off the substrate 140 back onto the substrate 140. The reflector 430 may be secured to the clamp ring 420. The reflector 430 can be made of a metal such as aluminum or stainless steel. The efficiency of the reflection can be improved by providing a highly reflective coating layer such as gold (Au). The reflector 430 can have one or more ports 432 connected to a cooling source (not shown). The ports 432 may be connected to a passage 434 formed in or on the reflector 430. The passage 434 is configured to flow a fluid such as water or a gas, such as helium, nitrogen or other gas to cool the reflector 430.

Process gas may be supplied from a process gas source 436 is introduced into the process region 412 through a process gas inlet 438 formed in the sidewall of the base ring 408. The process gas inlet 438 is configured to direct the process gas in a generally radially inward direction. During a film formation process, the substrate support 404 may be located in the processing position, which is adjacent to and at about the same elevation as the process gas inlet 438, allowing the process gas to flow up and round along flow path 440 across the upper surface of the substrate 140 in a laminar flow regime. The process gas exits the process region 412 (along flow path 442) through a gas outlet 444 located on the side of the process chamber 400 opposite the process gas inlet 438. Removal of the process gas through the gas outlet 444 may be facilitated by a vacuum pump 446 coupled thereto. As the process gas inlet 438 and the gas outlet 444 are aligned to each other and disposed approximately at the same elevation, it is believed that such a parallel arrangement, when combined with the upper dome 406, will enable a generally planar, uniform gas flow across the substrate 140. Further radial uniformity may be provided by the rotation of the substrate 140 through the substrate support 404.

A purge gas may be supplied from a purge gas source 448 to the purge region 414 through an optional purge gas inlet 450 formed in the sidewall of the base ring 408. The purge gas inlet 450 is disposed at an elevation below the process gas inlet 438. If the circular shield 422 or a pre-heat ring (not shown) is used, the circular shield or the pre-heat ring may be disposed between the process gas inlet 438 and the purge gas inlet 450. In either case, the purge gas inlet 450 is configured to direct the purge gas in a generally radially inward direction. During a film formation process, the substrate support 404 may be located at a position such that the purge gas flows down and round along flow path 452 across a back side 402 of the substrate support 404 in a laminar flow regime. Without being bound by any particular theory, the flowing of the purge gas is believed to prevent or substantially avoid the flow of the process gas from entering into the purge region 414, or to reduce diffusion of the process gas entering the purge region 414 (i.e., the region under the substrate support 404). The purge gas exits the purge region 414 (along flow path 454) and is exhausted out of the process chamber through the gas outlet 444, which is located on the side of the process chamber 400 opposite the purge gas inlet 450.

Similarly, during the purging process, the substrate support 404 may be located in an elevated position to allow the purge gas to flow laterally across the back side 402 of the substrate support 404. It should be appreciated by those of ordinary skill in the art that the process gas inlet, the purge gas inlet and the gas outlet are shown for illustrative purpose, since the position, size, or number of gas inlets or outlet etc. may be adjusted to further facilitate a uniform deposition of material on the substrate 140. Another option may be to provide a purge gas through the process gas inlet 438. In some embodiments, the purge gas inlet 450 may be configured to direct the purge gas in an upward direction to confine process gases in the process region 412.

Figure 5:
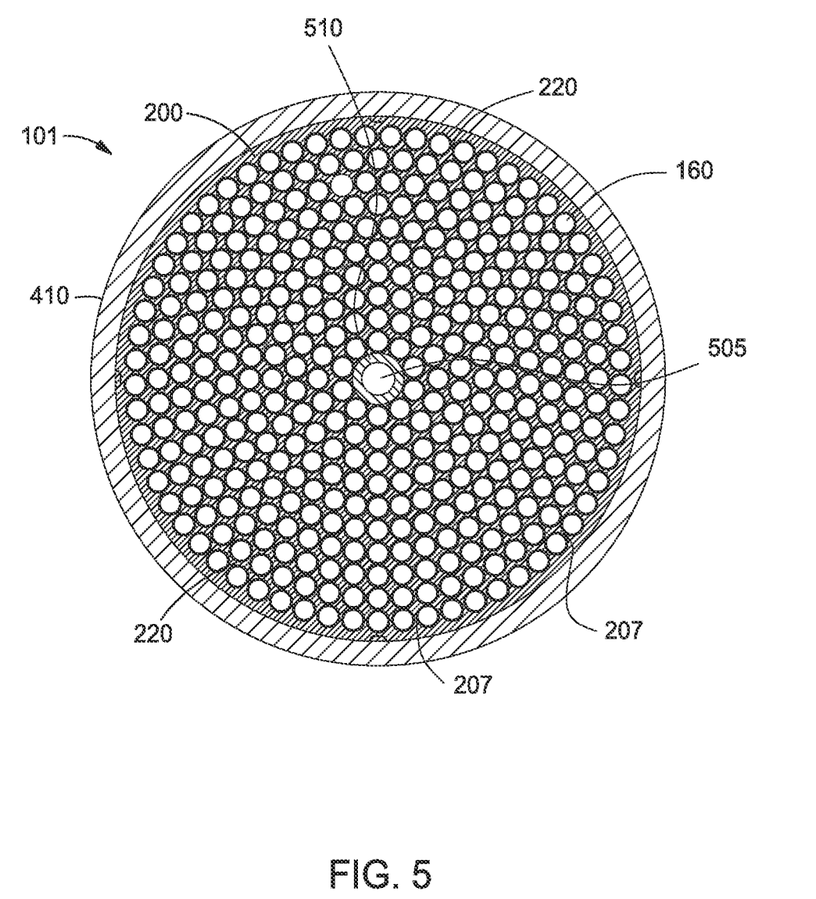
FIG. 5 is a cross-sectional view of the light pipe window structure across section lines 5-5 of FIG. 4.

FIG. 5 is a cross-sectional view of the light pipe window structure 101 across section lines 5-5 of FIG. 4. The light pipe window structure 101 is substantially similar to the embodiment shown in FIG. 2C, with the exception of the rim 410 (replacing the retainer 159) and a central passageway 505. The central passageway 505 may include a circular sidewall 510 having an inside diameter to receive and allow movement of the central shaft 415 (shown in FIG. 4). In this embodiment, the rim 410, the circular sidewall 510 as well as the transparent plate 114 (not shown in the cross-sectional view) and the transparent body 125 may be made of materials described above, and joined by the exemplary methods described above. While the central passageway 505 and/or the central shaft 415 are generally centered relative to a longitudinal axis of the process chamber 400, other passageways may be provided in the light pipe window structure 101 at positions other than the center. For example, one or more passageways (not shown) may be provided to accommodate a shaft that is off-center relative to the longitudinal axis of the process chamber 400.

Figure 6:
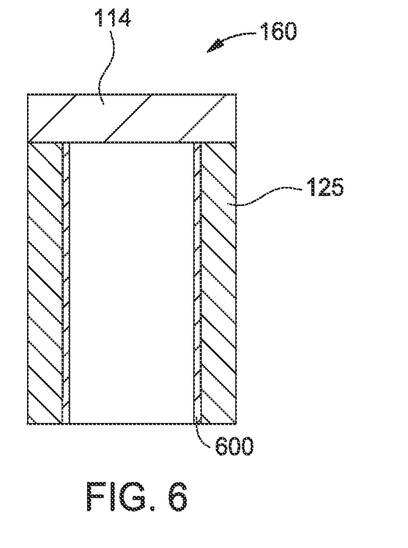
FIG. 6 is a side cross-sectional view of one of the light pipe structures that may be used with the light pipe window structure as described herein.

FIG. 6 is a side cross-sectional view of one of the light pipe structures 160 that may be used with the light pipe window structure 101 as described herein. The light pipe structure 160 may be circular in shape and include a coating 600. The coating 600 may be a reflective material, such as silver (Au) or gold (Ag).

Figure 7:
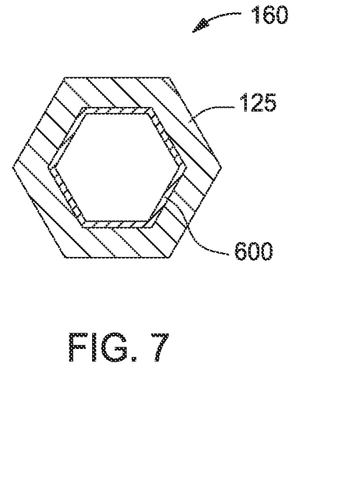
FIG. 7 is a top cross-sectional view of one of the light pipe structures that may be used with the light pipe window structure as described herein.

FIG. 7 is a top cross-sectional view of one of the light pipe structures 160 that may be used with the light pipe window structure 101 as described herein. The light pipe structure 160 may be hexagonal in cross-section, and include the coating 600.

Figure 8:
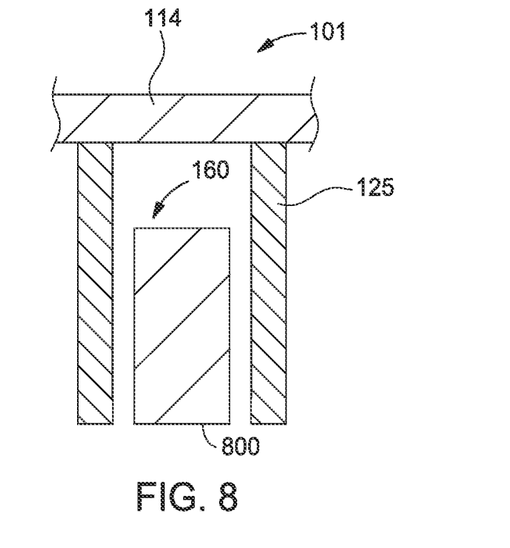
FIGS. 8-10 are partial side cross-sectional views showing additional embodiments of a light pipe window structure that may be used with the process chambers disclosed herein.
Figure 9:
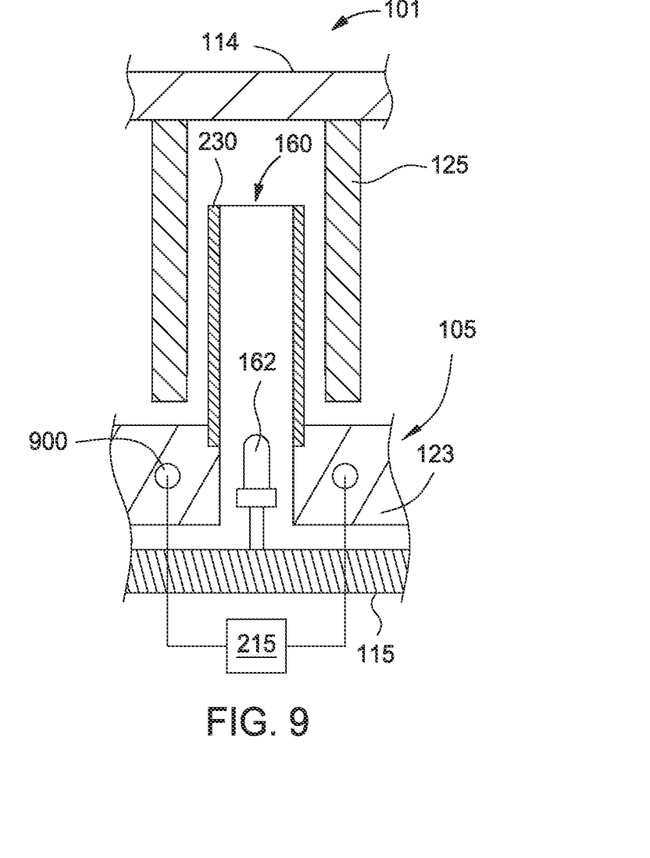
Figure 10:
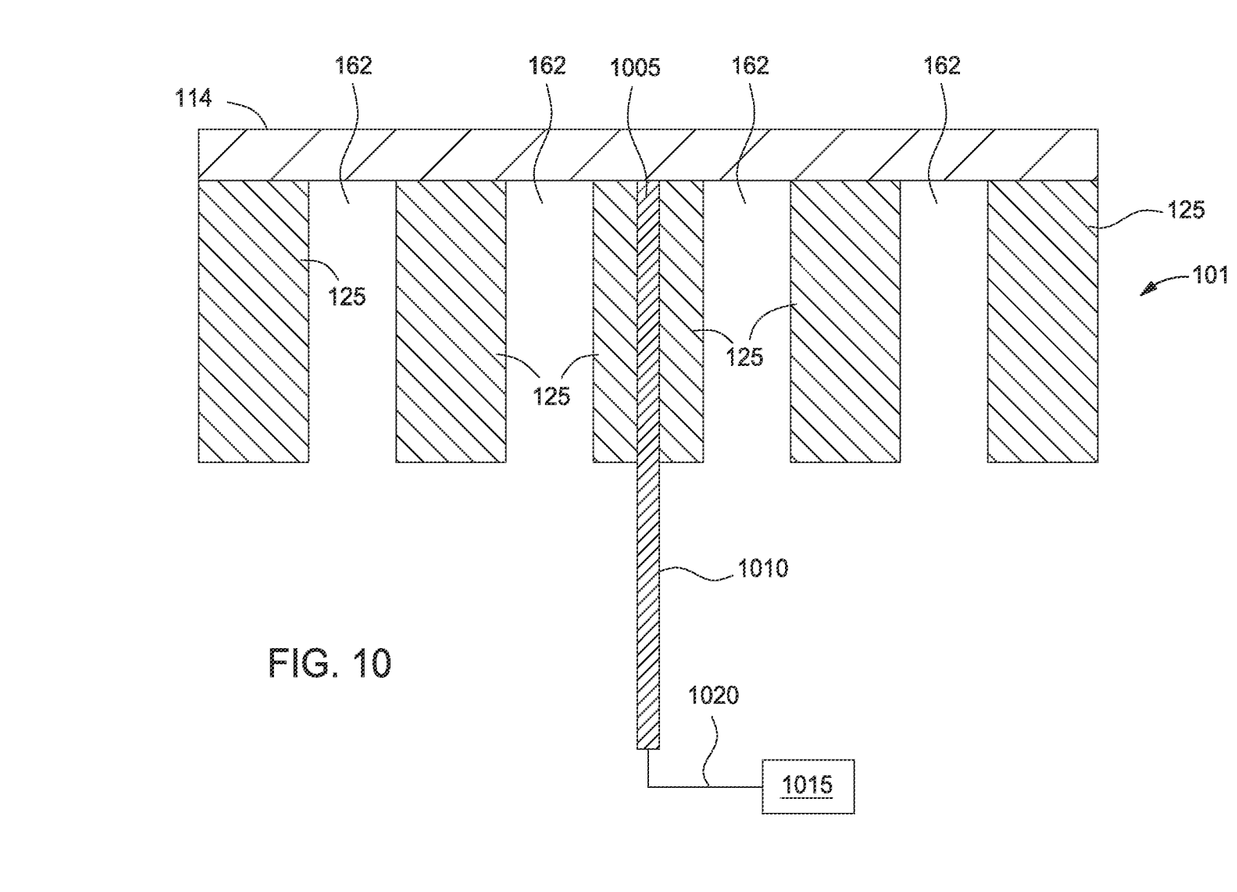

FIGS. 8-10 are side cross-sectional views showing additional embodiments of the light pipe window structure 101. In FIG. 8, the volume of the light pipe structure 160 includes a light pipe column 800 made of a transparent material as described herein. The light pipe column 800 may be a solid transparent body that provides TIR. While only one light pipe structure 160 is shown in this Figure, other light pipe structures 160 in the light pipe window structures as described herein may include the light pipe column 800. In one embodiment, at least a portion of the light pipe structures 160 having the light pipe column 800 disposed therein may be angled inwardly toward a central axis of the process chamber 400 (FIG. 4) to direct radiant energy to pass through the transparent plate 114 at a non-normal angle relative to the plane of the transparent plate 114. FIG. 9 shows a light pipe structure 160 having a sleeve 230 disposed therein that is thermally coupled to the housing 123 of the lamphead assembly 105. In this embodiment, the lamphead assembly 105 includes channels 900 that are coupled to the coolant source 215. The coolant source 215 may include water in one embodiment.

FIG. 10 shows a smaller light pipe 1005 formed in, or disposed in, the transparent material 125. The light pipe 1005 may comprise, or is utilized for insertion of, a transparent rod 1010. The transparent rod 1010 may be made of sapphire or other transparent material as described herein. The transparent rod 1010 is utilized to couple with a sensor 1015, such as an optical pyrometer, via an optional fiber optic cable 1020, in one embodiment. The transparent rod 1010 may have a diameter of about 1 mm to about 2 mm. The transparent rod 1010 may have a length that extends from a surface of the transparent plate 114 to an end thereof disposed below the housing 123 of the lamphead assembly 105 as well as the circuit board 115 (shown in FIG. 4). Having one or more small light pipes, such as the light pipe 1005, at specific radial positions or zones within the transparent material 125 just below the transparent plate 114, allows for temperature sensors, such as the sensor 1015, to be significantly closer to the plane of the substrate support 104 and/or the substrate 140 (shown in FIG. 4). The proximity of the transparent rod 1010 to the substrate support 104 and/or the substrate 140 allows for a smaller measurement site which enables finer temperature control. While not shown, an array of transparent rods, such as the transparent rod 1010, may be used in the process chambers as described herein to control the temperature of the substrate 140 during processing.

Utilization of the light pipe window structures 101 as described herein allows a lamphead assembly 105 (shown in FIGS. 3 and 4) to be disposed outside of the chamber interior volume. In some embodiments, the transparent plate 114 of the light pipe window structures 101 as described herein provide a process chamber boundary (e.g., a boundary of the interior volume where processing occurs). Seals, such as o-rings and the like, may be utilized to seal the interior volume 120 of the chamber and allow the lamphead assembly 105 to be positioned external to the interior volume. Utilization of the light pipe window structures 101 as described herein provides closer spacing between the lamphead assembly 105 and a substrate, while preserving intensity and/or the radiance pattern of the energy sources 162 (shown in FIGS. 1 and 4).

While the foregoing is directed to specific embodiments, other and further embodiments may be devised without departing from the basic scope thereof, and the scope thereof is determined by the claims that follow.

The invention claimed is:

1. A light pipe window structure for use in a thermal process chamber, the light pipe window structure comprising:
 a transparent plate;
 a housing coupled to the transparent plate, the transparent plate having a recessed portion that is in a concave shape relative to the housing;
 a plurality of openings formed in a transparent body sandwiched between the transparent plate and the housing, each of the plurality of openings comprising a light pipe structure, wherein each of the light pipe structures comprise a reflective surface on an interior surface of each of the openings and having a longitudinal axis disposed in a substantially perpendicular relation to a plane defined by a top surface of the transparent plate; and
 a transparent rod having a length extending from the transparent body to a position below the housing, the transparent rod coupled with a fiber optic cable that is utilized to couple with a temperature sensor.

2. The light pipe window structure of claim 1, further comprising:
 a retainer joined with the transparent plate and surrounding the plurality of light pipe structures, wherein the retainer comprises a sealed enclosure.

3. The light pipe window structure of claim 1, wherein the housing includes a plurality of tubes that each align with an opening of the plurality of openings.

4. The light pipe window structure of claim 1, wherein each of the light pipe structures comprise a circular shape.

5. The light pipe window structure of claim 1, wherein each of the light pipe structures comprise a polygonal shape.

6. The light pipe window structure of claim 1, wherein the housing includes openings that substantially align with the openings formed in the transparent body.

7. The light pipe window structure of claim 1, wherein the housing comprises an electrically conductive material.

8. The light pipe window structure of claim 1, wherein the reflective surface comprises a reflective coating.

9. The light pipe window structure of claim 1, wherein the reflective surface comprises a tubular sleeve made of a reflective material.

10. A light pipe window structure for use in a thermal process chamber, the light pipe window structure comprising:
 a transparent plate including a recessed portion extending from a perimeter of the transparent plate to a center thereof;
 a housing coupled to the transparent plate;
 a plurality of light pipe structures formed in a transparent body sandwiched between the transparent plate and the housing, each of the plurality of light pipe structures comprising a reflective surface and having a longitudinal axis disposed in a substantially perpendicular relation to a plane defined by a top surface of the transparent plate, wherein the reflective surface comprises a reflective coating; and
 a transparent rod having a length extending from the transparent body to a position below the housing, the transparent rod coupled with a fiber optic cable that is utilized to couple with a temperature sensor.

11. The light pipe window structure of claim 10, wherein the housing includes openings that substantially align with the plurality of light pipe structures.

12. The light pipe window structure of claim 10, wherein the housing comprises an electrically conductive material.

13. The light pipe window structure of claim 10, further comprising:
 a sealed enclosure joined with the transparent plate and surrounding the plurality of light pipe structures.

14. A light pipe window structure for use in a thermal process chamber, the light pipe window structure comprising:
 a transparent plate including a recessed portion extending from a perimeter of the transparent plate to a center thereof;
 a housing coupled to the transparent plate;
 a plurality of openings formed in a transparent body that is coupled between the transparent plate and the housing, each of the plurality of openings comprising a light pipe structure, wherein each of the light pipe structures comprise a reflective surface and having a longitudinal axis disposed in a substantially perpendicular relation to a plane defined by a top surface of the transparent plate, wherein the reflective surface comprises a tubular sleeve made of a reflective material;
 a sealed enclosure joined with the transparent plate and surrounding the plurality of light pipe structures
 a transparent rod extending out of the transparent body to a position below the housing, the transparent rod coupled with a fiber optic cable that is utilized to couple with a temperature sensor.

15. The light pipe window structure of claim 14, wherein the sealed enclosure includes a plurality of fluid conduits formed therein.

16. The light pipe window structure of claim 15, wherein at least a portion of the plurality of fluid conduits comprise a first channel and a second channel for flowing a fluid between the plurality of light pipe structures adjacent thereto.

\* \* \* \* \*